United States Patent [19]

Ehnholm et al.

[11] Patent Number: 5,570,022

[45] Date of Patent: Oct. 29, 1996

[54] POWER SUPPLY FOR MRI MAGNETS

[75] Inventors: Gösta J. Ehnholm; Seppo T. Pekonen; Juha P. Virtanen, all of Helsinki, Finland

[73] Assignee: Picker Nordstar Inc., Helsinki, Finland

[21] Appl. No.: 293,379

[22] Filed: Aug. 19, 1994

[30] Foreign Application Priority Data

Aug. 20, 1993 [FI] Finland ................................ 933675

[51] Int. Cl.⁶ .................................................. G01R 33/20
[52] U.S. Cl. .......................... 324/319; 324/318; 335/296
[58] Field of Search ...................... 324/318, 319, 324/320, 322; 335/296–299, 300–306; 363/95–98, 41

[56] References Cited

U.S. PATENT DOCUMENTS

| 3,405,326 | 10/1968 | Barton et al. | 324/319 |
| 4,030,085 | 6/1977 | Ellis et al. | 324/322 |
| 4,616,174 | 10/1986 | Jørgensen | 324/117 |
| 4,689,730 | 8/1987 | Kimura | 363/21 |
| 4,768,002 | 8/1988 | Cronin | 333/176 |
| 4,893,070 | 1/1990 | Milberger et al. | 323/270 |
| 5,063,349 | 11/1991 | Roemer et al. | 324/318 |
| 5,144,238 | 9/1992 | Ehnholm | 324/316 |
| 5,172,061 | 12/1992 | Crooks et al. | 324/322 |
| 5,260,862 | 11/1993 | Marsh | 363/39 |
| 5,371,388 | 12/1994 | Oda | 257/280 |
| 5,450,011 | 9/1995 | Boeijen et al. | 324/322 |

FOREIGN PATENT DOCUMENTS

| 0481353 | 4/1992 | European Pat. Off. |  |
| 9208996 | 5/1992 | WIPO | 324/322 |

*Primary Examiner*—Sandra L. O'Shea
*Assistant Examiner*—Raymond Y. Mah
*Attorney, Agent, or Firm*—Timothy B. Gurin; John J. Fry

[57] ABSTRACT

Current supply for MRI magnet having an output impedance which has been tailored to have the desired shape by using voltage and current feedback. The impedance is small at frequencies which are large with respect to the magnet L/R and the impedance is large at very low frequencies.

21 Claims, 4 Drawing Sheets

POWER SUPPLY FOR MRI MAGNETS

BACKGROUND OF THE INVENTION

This invention relates to a power supply used to provide current for the resistive magnet of magnetic resonance imager in such a way that the magnetic field produced by the magnet exhibits high stability.

Magnetic resonance imaging (MRI) is a widely used diagnostic imaging method, which gives superior results compared with other modalities, such as x-rays or ultrasound. Its only drawback is the high cost of the equipment, typically 5–20 million Finnish Marks (~1–4 million US$). Thus, it is important to invent a way of decreasing the price.

The most common type of magnet (for MRI) is the superconducting one, which gives the highest field strengths, 0.5–2 Tesla, but which are expensive to produce and to use. The next most common one is the permanent type, which typically gives a field of 0.2–0.3 Tesla. The least used type is the resistive one, because it uses a lot of electrical power if a high field strength is to be obtained.

At lower fields, 0.1–0.2 T, the resistive magnet is the most economic solution, but its use has been limited because of the high requirements placed in MRI on the field stability, which has been difficult to fulfil with resistive magnets, which can be designed either with an air core or with an iron core.

To keep the quality of the MRI image unaffected the main magnetic field of the scanner has to be stable within 0.5–0.1 ppm (parts per million) during the imaging time (1–10 min). To obtain such a good field the current in the magnet has to be carefully controlled. In addition, external field disturbances must be attenuated.

The field strength is proportional to the magnet current. The temperature of the magnet wire can change several tenths of degrees, and this requires the power supply to work at a wide range of voltages. The field is further affected by the physical dimensions of the magnet, which may change with the temperature. This effect has to be compensated. The amount of compensation can be based on knowledge of the temperature, obtained by measuring it, or, alternatively, on a direct field measurement.

Monitoring and regulating the current within the required 0.5–0.1 ppm is difficult but possible. It can be done for example by measuring the voltage across a high quality resistor in series with the magnet. Another known method is to use a so called current transformer, as described in U.S. Pat. No. 4,616,174.

If external fields, varying with the time in the frequency range of 0.01–150 Hz, are superposed on the MRI field they will induce artifacts into the image. Superconducting magnets tend to keep their magnetic flux constant, and in this way attenuate external fields. A similar effect can be obtained by shorting the terminals of a resistive magnet for voltages in the said frequency range. This is, however, effective only for frequencies which are large compared with the L/R time constant of the magnet which typically has an L of about 1 Henry and an R of 1 Ohm and thus a time constant of about 1 second. This kind of attenuation cannot be obtained from a permanent magnet.

An additional requirement on the magnet power supply comes from the so called gradient fields. Gradient fields are fast changing fields which are added to the main field during imaging and induce voltage spikes into the magnet electrical circuit. These spikes can have magnitudes of several volts and a frequency content in the range of 1–2000 Hz. If the magnet power supply has a high output impedance at these frequencies it must also have a high dynamic range so as not to become nonlinear during the spikes. A low impedance supply, on the other hand, would produce a current surge during the voltage spike, which would disappear with a time constant $L/(R+R_{out})$, where L is the magnet inductance, R the magnet resistance, and $R_{out}$ the output resistance of the power supply.

Other required properties of the power supply are a good efficiency, which obviates the use of water cooling, and a low value for radiated electromagnetic interference. It is also desirable that the supply forms a clean load on the mains supply, meaning that it should include a so called $\cos\phi$ correction.

This application discloses a power supply, which fulfills all the presented requirements for a resistive MRI magnet. The invention is based on tailoring the desired shape on the output impedance by the use of two separate feedback loops.

SUMMARY OF THE INVENTION

In accordance with one embodiment of the present invention a magnet current source for use with a magnet in a magnetic resonance imager is provided. The magnet source is connected to a magnet of a magnetic resonance imager and outputs electrical power thereto. The current source has a feedback circuit connected between its output and input that causes the output impedance thereof to be large for low frequencies of electrical disturbances appearing at the sources output and small at high frequencies of electrical disturbances appearing at the sources output.

In accordance with a more limited aspect of the invention the current source output impedance is at least three orders of magnitude greater than the magnet impedance at low frequencies and the current source output impedance is at least one order of magnitude less than the magnet impedance at high frequencies.

In accordance with another aspect of the invention the feedback circuit is comprised of at least one of a voltage feedback and a current feedback, for feeding back a portion of the magnet source output to the magnet source input, and a magnetic field sensor feedback, for feeding back information on the strength of the magnetic field, measured by a magnetic field sensor disposed in the magnetic field of the magnet, to the current source input.

In accordance with a more limited aspect of the invention the magnet current source employs pulse width modulation.

In accordance with another more limited aspect of the invention a separately controllable feedback circuit is provided such that the output impedance can be momentarily increased at high frequencies. Moreover, the source can supply two or more different values of output current.

In accordance with another aspect of the invention a magnetic resonance imager for diagnostic magnetic resonance imaging is provided. The imager is comprised of a main magnetic field means for generating a main magnetic field and a gradient magnetic field means for imposing a gradient magnetic field on the main magnetic field. The main magnetic field means is comprised of a main magnet having a resistive and inductive component which have a cutoff-frequency. A power supply is connected to the main magnet for supplying voltage and current to the main magnet for producing a main magnetic field. The power supply has a feedback loop connected between the output and input end thereof for feeding back a portion of output that is related to at least one of the current delivered to the main magnet and the voltage produced across the main magnet. The feedback loop causes the power supply, in response to an alternating voltage appearing at the output of the power supply, to have an output impedance that is about the same as the resistive portion of main magnet impedance for frequencies of the alternating voltage greater than the cutoff-frequency. The feedback loop also causes the output impedance to grow from an impedance that is about the same as the resistive portion of main magnet impedance at frequencies near the cutoff-frequency to a maximum output impedance that is greater than the main magnet impedance at frequencies less than the cutoff-frequency.

In accordance with another aspect of the invention a method of controlling the output impedance of a power supply that is connected to a main magnet of a magnetic resonance imager is provided. In the method, the output current and voltage across the main magnet are measured. A portion of the voltage across the main magnet is feedback to the input of the power supply and the output current is converted to a voltage and a portion thereof is feedback to the input of power supply. The voltage feedback and converted current feedback cause the output impedance of the power supply to be about teh same as the resistive portion of main magnet impedance in response to an alternating voltage appearing at the output of the power supply having a frequency greater than the cutoff-frequency of the main magnet's inductive and resistive components. The voltage feedback and converted current feedback also causes the output impedance of the power supply to be about the same as the resistive portion of main magnet impedance at frequencies of alternating voltage near the cutoff-frequency, and the output impedance to grow to a maximum output impedance that is greater than the main magnet's impedance at frequencies progressively less than the cuttoff-frequency.

An advantage of the present invention is that the power supply operates as an almost ideal current source at low frequencies and operates as a low impedance voltage source at high frequencies.

Another advantage of the invention is that when the power supply is connected to a main magnet of a magnetic resonance imager, the power supply improves the stability of the current regulation at low frequencies and the inductance of the main magnet improves the stability of the current regulation at high frequencies.

Still another advantage of the present invention is that external field disturbances are attenuated.

Still other advantages will become apparent upon reading and understanding the following detailed description.

DETAILED DESCRIPTION OF THE PREFERRED EMBODIMENT

Figure 1:
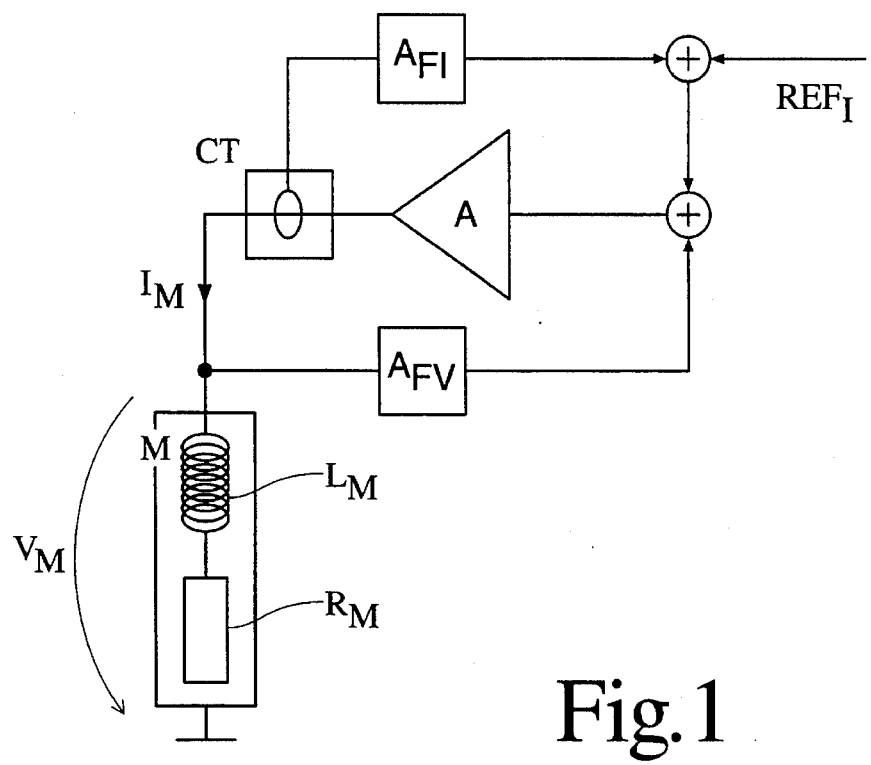
FIG. 1 shows a power supply in accordance with the present invention.

With reference to FIG. 1, amplifier A feeds magnet M with current $I_M$, producing voltage $V_m$ across magnet M's terminals. The impedance of the magnet comprises inductance $L_M$ in series with resistance $R_M$. The amplifier obtains a feedback signal both from the voltage $V_m$ and the current $I_M$. Each feedback signal has its corresponding weights $Ref_1$ is the desired set value for the current. CT is a current transducer used for measuring $I_M$.

Figure 2:
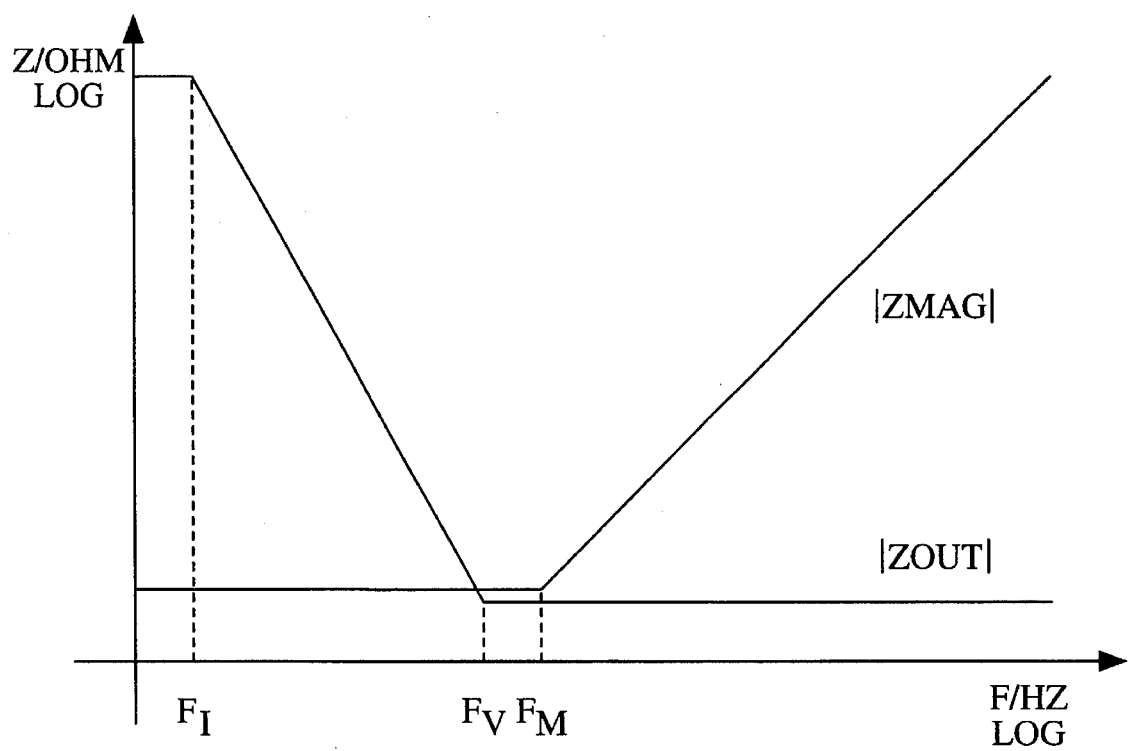
FIG. 2 shows the impedance of the magnet $|Z_{mag}|$ with frequency and the desired output impedance $|Z_{out}|$ of the power supply with frequency.

The presented arrangement can be used to implement an amplifier which has the output impedance shown in FIG. 2. The curve $|Z_{mag}|$ represents the magnitude of the magnet impedance. At low frequencies it is resistive, but above the frequency $f_m$ it becomes inductive, growing linearly with frequency. The curve $|Z_{out}|$ represents the desired magnitude of the supply output impedance. At very low frequencies, below $f_I$, the amplifier works as an almost ideal current source, with an impedance about $10^7$ times bigger than the expected changes in magnet resistance, so as to fulfil the required 0.1 ppm current regulation.

At frequencies above $f_V$ the amplifier acts as a short circuit across the magnet terminals, working now as a low impedance voltage source. In this way the inductance of the magnet is used for attenuating the external disturbances. For this to be efficient we require that $|Z_{out}|<|Z_{mag}|$. Because the magnet impedance grows with frequency the output impedance doesn't have to remain constant, as in the Figure, but is allowed to grow, as long as it keeps smaller than the magnet impedance. In order to profit from the magnet attenuation for all frequencies, one must choose $f_V<f_m$. In practice, however, it can be expedient to choose $f_V$ somewhat higher than $f_m$ as this keeps the settling times of the system conveniently low.

An apparatus built according to the invention is characterized by having an output impedance which is large at low frequencies ($f<f_m$), $10^6$ or more times the magnet resistance $R_M$, but which is low at high frequencies, typically less than or approximately equal to $R_M$.

The above described function of the invention, which was implemented using voltage feedback, can also, within some restrictions, be made using only current sensing. The magnet impedance, $Z_M=jwL_M+R_M$, becomes mainly inductive at high frequencies, where $R_M$ becomes insignificant. For a constant inductance L we know that the voltage is equal to $V=LdI/dt$, where $dI/dt$ is the time derivative of the current. Thus, knowing the value of L and I, it is possible to obtain the magnet voltage by forming the derivative of I.

If the magnet is built with an iron core its inductance, however, becomes a function of the permeability of the iron. This, in turn, is a function of the magnetic flux flowing through the iron. The flux can change, for instance from external disturbances, and thus the inductance can also change. In a magnet with an air core the inductance is constant and thus the voltage can be formed from the derivative of the current, as described above. In practical cases, however, it often not desirable to use derivating circuits.

Figure 3:
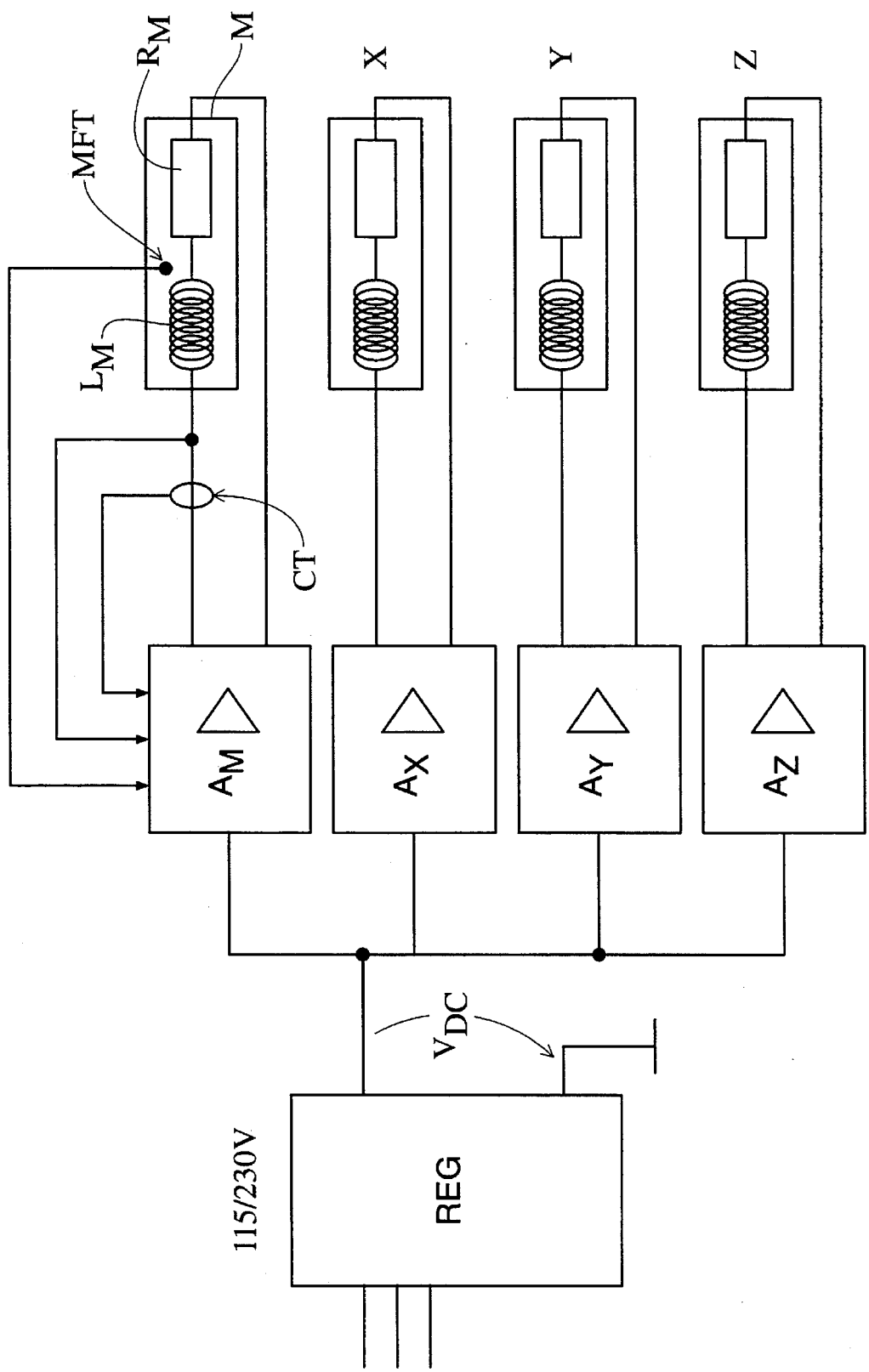
FIG. 3 shows a block diagram of an MRI system which uses a power supply of FIG. 1.

In the following an embodiment of the invented MRI magnet power supply will be presented by way of example:

A block diagram of the system is shown in FIG. 3. It comprises magnet amplifier $A_M$, gradient amplifiers $A_X$, $A_Y$, and $A_Z$, and a common mains unit REG. In addition, the system comprises current transducer CT, and optionally a magnet field transducer MFT. $A_M$ feeds current to the magnet M, which has inductance $L_M$, and resistance $R_M$. Gradient amplifiers $A_X$, $A_Y$, and $A_Z$ feed currents to the corresponding x, y, and z gradient coils.

Amplifier $A_M$, supplying the magnet current, is of the pulse-width modulated (PWM) type, in contrast to presently used technology, which employs linear output stages, as described for example in patent no. EP 0 481 353 A2. Using a PWM amplifier is not necessary for optimizing the double feedback and tailored output impedance described above, but it has some other significant advantages which will be treated next.

As said before, the magnet wire might change up to 30 degrees Celsius during its use. For aluminum wire this makes a 12 percent change in the electrical resistance, and thus in the magnet voltage. If this voltage is 200 V, the dynamic range needed from the output stage is at least 30 V. If a linear stage is used one is compelled to regulate the intermediate voltage $V_{DC}$ in order to keep the output stage at a reasonable level of dissipation. A PWM amplifier, on the other hand, enables one to use a fixed intermediate voltage.

If a fixed $V_{DC}$ is used one can also connect the gradient amplifiers $A_X$, to $A_Y$, and $A_Z$ to the same intermediate voltage regulator (REG) as $A_M$. The power used for the gradients is at most one third of the magnet power, so they will not increase the size and prize of the REG unit appreciably. In simple cases the REG unit might comprise just a mains transformer and a rectifier bridge. With a regulated bridge, built with thyristors, one can obtain stability of $V_{DC}$ against changes in the mains voltage. An even more desirable solution is to include so called cosø regulation. This can be implemented, simultaneously with stabilization of $V_{DC}$, if so called IGBT transistors are used in the REG unit. Especially in the last case, which employs rather complicated circuits, it becomes economical to use a common REG unit.

The magnet supply $A_M$ and the gradient supplies $A_X$, $A_Y$, and $A_Z$ can be of identical design, which is an advantage for manufacturing them. Their similarity also facilitates the synchronization of their individual chopping frequency, which is important for avoiding beat signals which would otherwise be generated at the difference between the chopper frequencies. Placing the amplifiers together in the same cabinet helps in grounding them and shielding them for avoiding electrical interference.

Although the amplifiers are built identically they need different feedback circuits. The gradient amplifiers are operated as voltage controlled current sources, and are based on rather precise (about 0.1%) current feedback. The magnet supply $A_M$, on the other hand, employs two feedback loops, as described above. At DC and frequencies significantly below $f_I$ it works as a high impedance current source, obtaining its feedback from a very precise current transducer CT. The transducer can comprise for instance a carefully designed series resistor, or some advanced current transformer design. Above the frequency $f_V$ the amplifier operates as a voltage source, with feedback derived from the magnet voltage.

Instead of using the precise current measurement one can measure the magnetic field directly, with a magnetic field transducer MFT, and use its output in place of the current feedback. Yet another possibility is to use the current and field methods in combination, by employing the field measurement for adjusting the set point of the current transducer.

Figure 4:
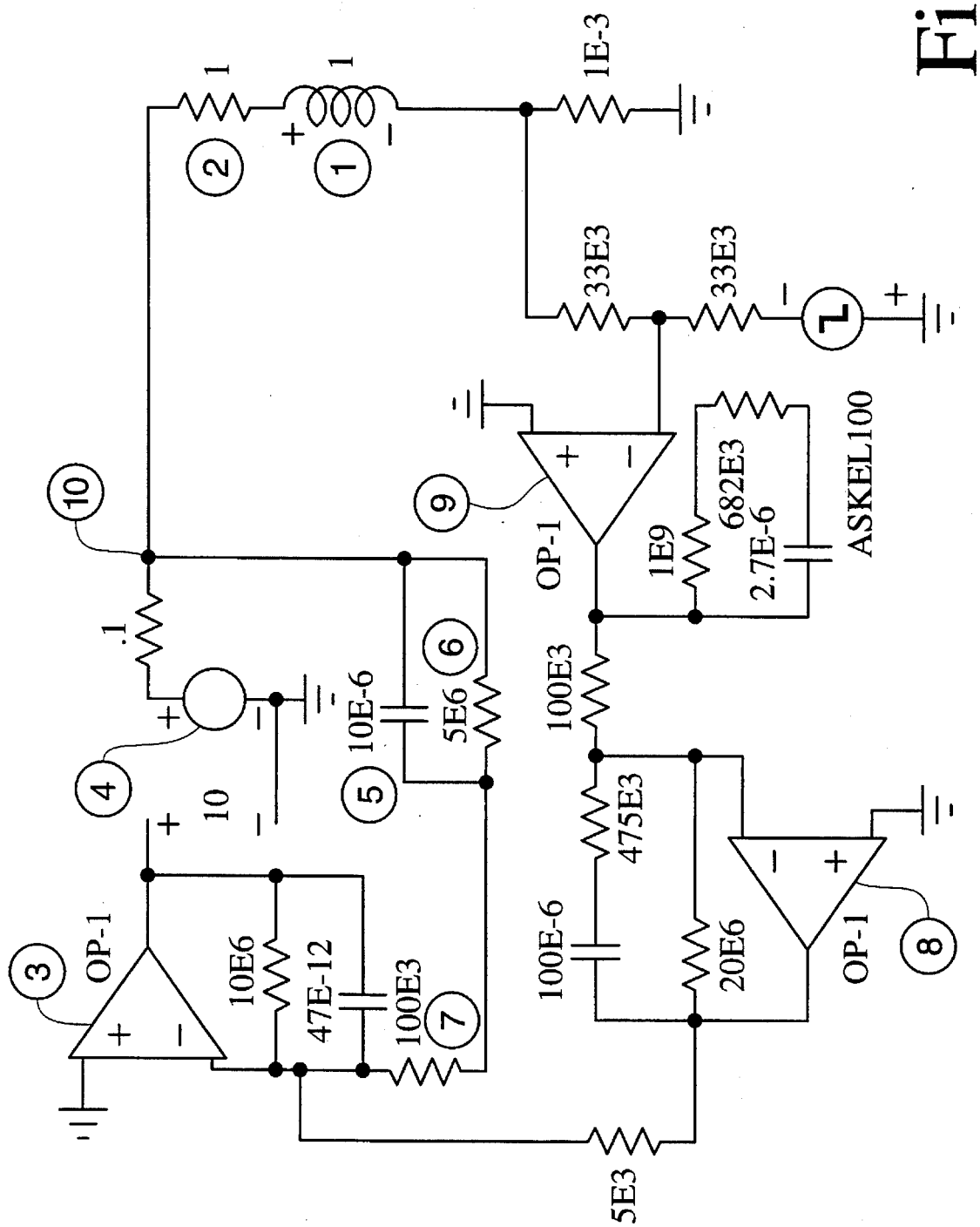
FIG. 4 shows a circuit diagram of the power supply of the present invention.

In FIG. 4 we show a schematic wiring diagram, with the desired electronic properties of the magnet supply. The diagram has been fed to a computer simulation program. In the diagram the magnet is represented by the inductance (1) and the resistance (2). The operational amplifier (3) and current generator (4) represent the amplifier A of FIG. 1. The resistors (6) and (7) and the capacitor (5) implement the voltage feedback $A_{FV}$ of FIG. 1, and the amplifiers (8,9) implement the current feedback $A_{FI}$.

Figure 5:
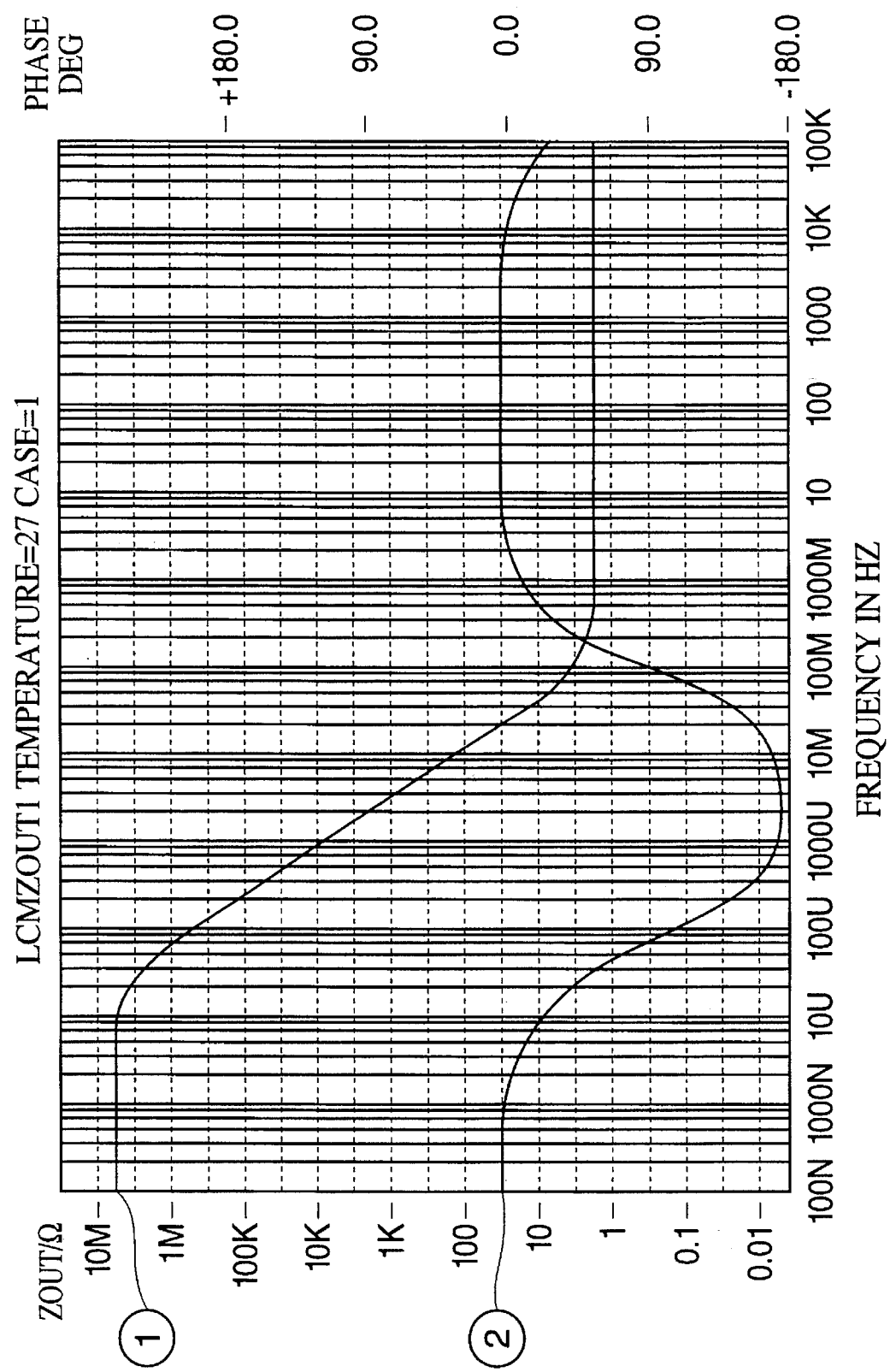
FIG. 5 is a computer simulation of the output impedance of the circuit of FIG. 4.

FIG. 5 shows the result of a computer simulation, with curve (1) being the magnitude and curve (2) the phase of the output impedance of the circuit of FIG. 4. The output impedance refers to point (10) in FIG. 4, in the absence of the magnet itself. The time constant of the magnet of FIG. 4 is 1 second, corresponding roughly to 1 Hz. From FIG. 5 we see that the supply output impedance for frequencies above 1 Hz is about 2 ohms, which is close to the resistance of a typical MRI magnet. For very low frequencies the output impedance is $10^6$ ohms, as required for exact current regulation. The phase of the impedance (2) is below 180 degrees for all frequencies, which means that the system is stable.

Thus our example demonstrates that an amplifier with feedback according to the invention is possible to implement, using practical values of the components.

In certain applications of MRI it is desirable to change the main magnetic field during imaging. One such case is the use of contrast agents based on the so called Overhause effect. This is explained in detail in U.S. Pat. No. 5,144,238. The strength of the main field can be changed by changing the current in the magnet. For this a fast current source is needed, which has a large range of output voltages. This is because a large, quickly changing voltage is needed to ramp the current fast through the magnet, which has a large inductance.

For this case the current supply is modified in the following way: When a new current value is desired, the current feedback is momentarily modified changing the circuit into one which gives a fast current feedback. The supply will then have a large output impedance also for high frequencies. As a result it will settle quickly to the new current value. After it has settled, which takes a certain given time, the feedback is modified back to the previous configuration. In this way the current can be changed fast, and this without compromising on the other properties of the supply.

The above invention has been described with reference to the preferred embodiments. Obvious modifications and combinations will occur to others upon reading and understanding the preceding description. It is intended that the invention be construed as including all such modifications, combinations and alterations insofar as they come within the scope of the appended claims or the equivalents hereof.

Having described the preferred embodiment the invention is now claimed to be:

1. A magnetic resonance imager for diagnostic magnetic resonance imaging, said imager comprising:

a main magnetic field means for generating a main magnetic field; and a gradient magnetic field means for imposing a gradient magnetic field on the main magnetic field, said main magnetic field means comprising:

a main magnet being characterized by an inductance and a resistance which define a cutoff-frequency; and a power supply having an output connected to said main magnet for supplying voltage and current to the main magnet for producing a main magnetic field, said power supply having a feedback loop from the output thereof that is related to at least one of the current delivered to said main magnet and the voltage produced across said main magnet, said feedback loop causing said power supply to have (i) an output impedance that is about the same as the resistive position of the main magnet impedance for frequencies above the cutoff-frequency and (ii) an output impedance that grows from an impedance that is about the same as the resistive portion of the main magnet impedance at frequencies near the cutoff-frequency to a maximum output impedance that is greater than the main magnet impedance at frequencies less than the cutoff-frequency.

2. The magnetic resonance imager as set forth in claim 1 wherein the maximum output impedance of the power supply is greater than $10^3$ times the resistive component of the main magnet.

3. The magnetic resonance images as set forth in claim 1 wherein the feedback loop is comprised of one or more of:
  (i) a voltage weighing circuit disposed between the output of the power supply and the Input of the power supply for feeding back a weighted portion the output voltage of the power supply to the input of the power supply; and
  (ii) a current sensor disposed on the output of the power supply for sensing the current from the power supply; and a current weighing circuit disposed between the current sensor and the input of the power supply for converting the sensed current into a weighted voltage that is fed back to the input of the power supply.

4. A method of controlling the output impedance of a power supply that is connected to main magnet of a magnetic resonance imager, the main magnet being characterized by an inductance and a resistance which define a cutoff frequency, said method comprising:
  measuring the output current of the power supply and generating a signal indicative thereof;
  feeding back a portion of the signal indicative of the output current to the power supply;
  measuring the voltage across the main magnet and generating a signal indicative thereof;
  feeding back a portion of the signal indicative of the voltage across the main magnet to the power supply;
  causing the output impedance of the power supply to vary as a function of the current feedback and the voltage feedback such that the output impedance of the power supply
    (i) is about the same as the resistive portion of main magnet impedance at frequencies greater than the cutoff-frequency, and
    (ii) increases to a maximum output impedance that is greater than the main magnet's impedance at frequencies less than the cutoff-frequency.

5. A magnet system for a magnetic resonance imaging apparatus, the magnet system comprising:
  a main magnet for generating a magnetic field;
  a power supply for supplying voltage and current to the main magnet, the power supply comprising means for causing the power supply to have an output impedance approximately equal to the resistance of the main magnet in at least a range of frequencies above a frequency determined in relation to a characteristic of the main magnet and an output impedance greater than the main magnet impedance in at least a range of frequencies below said frequency determined in relation.

6. The magnet system of claim 5 wherein the means for causing comprises a feedback loop related to the voltage supplied to the main magnet.

7. The magnet system of claim 6 wherein the means for causing comprises a feedback loop related to the current supplied to the main magnet.

8. The magnet system of claim 5 wherein the means for causing comprises a feedback loop related to the current supplied to the main magnet.

9. The magnet system of claim 5 wherein the main magnet is characterized by an inductance and a resistance which define a cutoff frequency and the characteristic is the cutoff frequency.

10. The magnet system of claim 5 wherein the frequency is less than the cutoff frequency.

11. The magnet system of claim 9 wherein the output impedance reaches a substantially maximum value at a second frequency which is below the cutoff frequency.

12. A magnet system for a magnetic resonance imaging apparatus, the magnet system comprising:
  a main magnet for generating a magnetic field, the magnet having an inductance and a resistance which define a cutoff frequency; and
  a power supply for supplying power to the magnet, the power supply comprising means for causing the power supply to act as a voltage source at a frequency above a frequency determined in relation to a characteristic of the magnet and as a current source at a frequency below said frequency determined in relation.

13. The magnet system of claim 12 wherein the means for causing comprises a feedback loop that is related to the voltage delivered to the main magnet.

14. The magnet system of claim 12 wherein the magnet is characterized by a resistance and an inductance which define a cutoff frequency and the characteristic is the cutoff frequency.

15. The magnet system of claim 14 wherein the frequency determined in relation is above the cutoff frequency.

16. The magnet system of claim 12 wherein the means for causing causes the power supply to act as a voltage source over at least a range of frequencies above the frequency determined in relation.

17. The magnet system of claim 12 wherein the means for causing causes the power supply to act as a current source over at least a range of frequencies below the frequency determined in relation.

18. A magnet system for use in a magnetic imaging apparatus, the magnet system comprising:
  a main magnet having an inductance and a resistance; and
  a power supply for supplying voltage and current to the magnet, said power supply acting as a current source over at least a range of frequencies below a frequency determined in relation to a characteristic of the magnet and as a voltage source over at least a range of frequencies above the frequency determined in relation.

19. The magnet system of claim 18 wherein the characteristic is the cutoff frequency defined by the inductance and the resistance.

20. The magnet system of claim 18 wherein the power supply acts increasingly a current source over at least a range of frequencies as frequency is decreased below the frequency in relation.

21. The magnet system of claim 18 wherein the power supply acts as a current source at DC.

* * * * *